United States Patent
Kijima et al.

(10) Patent No.: US 6,206,962 B1
(45) Date of Patent: *Mar. 27, 2001

(54) SEMICONDUCTOR LIGHT EMITTING DEVICE AND METHOD OF MANUFACTURING SAME

(75) Inventors: Satoru Kijima; Hiroyuki Okuyama, both of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,749

(22) Filed: Oct. 27, 1998

(30) Foreign Application Priority Data

Oct. 28, 1997 (JP) .................................................. 9-295940

(51) Int. Cl.⁷ ................................................ C30B 23/00

(52) U.S. Cl. .................................... 117/108; 438/479

(58) Field of Search ............................ 257/103; 117/108; 438/479

(56) References Cited

U.S. PATENT DOCUMENTS 5,617,446 * 4/1997 Ishibashi et al. ...................... 372/96

* cited by examiner

*Primary Examiner*—Olik Chaudhuri
*Assistant Examiner*—Douglas A. Wille
(74) *Attorney, Agent, or Firm*—Sonnenschein, Nath & Rosenthal

(57) ABSTRACT

An n-type cladding layer, the first guiding layer, an active layer, the second guiding layer, a p-type cladding layer, a backing layer, a contact layer, a superlattice layer and a cap layer are stacked in this order on an n-type substrate. The cap layer comprises p-type ZnTe and has a thickness of less than 10 nm. The contact layer is comprised of p-type ZnSe and the concentration of nitrogen added to the contact layer is in the range of 1 to $2\times10^{18}$ cm$^{-3}$. The backing layer comprises p-type ZnSSe mixed crystal and the concentration of nitrogen added to the backing layer is higher than that of the contact layer, in the range of 1 to $3\times10^{18}$ cm$^{-3}$. Before the corresponding Group II–VI compound semiconductor layers are grown by the MBE method, the temperature of cells is once increased. The operating voltage of the semiconductor light emitting device can be lowered by increasing the carrier concentrations of the Group II–VI compound semiconductor layers between the p-side electrode and the p-type cladding layer.

9 Claims, 8 Drawing Sheets

SEMICONDUCTOR LIGHT EMITTING DEVICE AND METHOD OF MANUFACTURING SAME

BACKGROUND OF THE INVENTION

1. Field of the Invention

The present invention relates to a semiconductor light emitting device having a structure in which an n-type cladding layer, an active layer and a p-type cladding layer, respectively made of a Group II–VI compound semiconductor, are sequentially stacked and to a method of manufacturing same.

2. Description of the Related Art

In recent years, a demand for the high density, high resolution of recording and reproduction of an optical disc and a magneto-optic disc rises. There is also a marked tendency to develop a high brightness display device and a low-loss optical fiber communication device as well as an optical analytic device for DNA and a particular chemical substance. In response to them, the development of semiconductor light emitting devices capable of emitting green or blue light has been demanded as their light sources.

As materials for composing the green or blue light emitting semiconductor devices, Group II–VI compound semiconductors each of which comprises at least one element of Group II elements of zinc (Zn), magnesium (Mg), beryllium (Be), cadmium (Cd), mercury (Hg) and manganese (Mn) and of at least one of elements of Group VI of oxygen (O), sulfur (S), selenium (Se) and tellurium (Te) hold great promise.

To obtain a semiconductor light emitting device having high luminous efficiency, it is necessary to improve the crystallinity of the Group II–VI compound semiconductors. Among the Group II–VI compound semiconductors, mixed crystal of ZnMgSSe, in particular, can lattice-match with a substrate comprising GaAs or ZnSe which is excellent in crystallinity and easy to obtain, which enables it to improve crystallinity. The ZnMgSSe mixed crystal is, therefore, particularly known as a material for the guiding layer and the cladding layer of a semiconductor light emitting device (as shown in, for example, Electronic Letters 28 (1992), page 1,798).

The Group II–VI compound semiconductors are, however, generally difficult to have high carrier concentrations even if p-type impurities are added thereto. The mixed crystal of ZnMgSSe, for example, has a low carrier concentration of only about $1 \times 10^{17}$ to $2 \times 10^{17}$ cm$^{-3}$. Among materials which lattice-match with GaAs, ZnSSe mixed crystal can have a higher carrier concentration than ZnMgSSe, however, at most, it is only about $7 \times 10^{17}$ cm$^{-3}$. For that reason, even if a p-side electrode is formed through a ZnSSe layer above a cladding layer made of ZnMgSSe mixed crystal, it is difficult to maintain an ohmic contact with the p-side electrode, thereby causing a rise in operating voltage. Due to this, power consumption increases and, at the same time, heat is generated disadvantageously resulting in a deterioration in device.

In the prior art in consideration of these disadvantages, Group II–VI compound semiconductor layers capable of obtaining high carrier concentrations without lattice-matching with GaAs are formed above the ZnSSe layer to lower operating voltage. A ZnSe layer, for example, capable of obtaining a carrier concentration of about $1 \times 10^{18}$ cm$^{-3}$ is formed on the ZnSSe layer and a ZnTe layer capable of obtaining a carrier concentration of about $1 \times 10^{19}$ cm$^{-3}$ is formed on the ZnSe layer.

The conventional semiconductor light emitting device can maintain an ohmic contact between the ZnTe layer and the p-side electrode. The carrier concentration of the ZnSe layer is, however, low and it is impossible to sufficiently lower operating voltage. As a result, the conventional device is disadvantageous in that sufficiently longer life time cannot be expected. The reason is considered to be the influence of the ZnTe layer.

SUMMARY OF THE INVENTION

The present invention has been made in view of the above-stated disadvantages. It is therefore an object of the present invention to provide a semiconductor light emitting device capable of lowering operating voltage by increasing the carrier concentrations of Group II–VI compound semiconductor layers provided between a p-side electrode and a p-type cladding layer, and to provide a method of manufacturing same.

A semiconductor light emitting device according to the present invention has a structure in which at least an n-type cladding layer, an active layer, a p-type cladding layer and a cap layer including Group II–VI compound semiconductors comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), respectively, are sequentially stacked, in which a p-side electrode is formed in contact with the cap layer, wherein the cap layer has a thickness of less than 10 nm.

Another semiconductor light emitting device according to the present invention is provided in which at least an n-type cladding layer, an active layer, a p-type cladding layer and a contact layer comprising Group II–VI compound semiconductors consists of at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te) are respectively stacked in this order, wherein p-type impurities in concentration of $1 \times 10^{18}$ cm$^{-3}$ or more and $2 \times 10^{18}$ cm$^{-3}$ or less are added to the contact layer.

A yet another semiconductor light emitting device according to the present invention is provided in which at least an n-type cladding layer, an active layer, a p-type cladding layer, a backing layer and a contact layer comprising Group II–VI compound semiconductors comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), are respectively stacked in this order, wherein p-type impurities in concentration of $1 \times 10^{18}$ cm$^{-3}$ or more and $3 \times 10^{18}$ cm$^{-3}$ or less are added to the backing layer.

A method for manufacturing a semiconductor light emitting device according to the present invention, comprises the steps of:

growing a plurality of Group II–VI compound semiconductor layers comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), by irradiating corpuscular beams onto a substrate, respectively; and thereby manufacturing the semiconductor light emitting device comprising at least an n-type cladding layer, an active layer, a p-type cladding layer, a backing layer and a contact layer sequentially stacked on the substrate, wherein a growth temperature in a growth step in which Group II–VI compound semiconductor layers are grown after the backing layer is formed, is set lower than the growth temperature of the formation of the preceding layers in the growth step.

Another method for manufacturing a semiconductor light emitting device according to the present invention comprises the steps of:

growing a plurality of Group II–VI compound semiconductor layers comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), by irradiating corpuscular beams onto a substrate, respectively; and thereby manufacturing the semiconductor light emitting device comprising at least an n-type cladding layer, an active layer, a p-type cladding layer, a backing layer and a contact layer stacked in this order on the substrate, wherein a growth temperature in the growth step of growing Group II–VI compound semiconductor layers after formation of the backing layer is set lower than a temperature in the growth step of growing Group II–VI compound semiconductor layers before formation of the backing layer.

A yet another method for manufacturing a semiconductor light emitting device according to the present invention comprises the steps of:

growing a plurality of Group II–VI compound semiconductors comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), by irradiating corpuscular beams onto a substrate, respectively; and thereby manufacturing the semiconductor light emitting device comprising at least an n-type cladding layer, an active layer, a p-type cladding layer, a backing layer, a contact layer and a cap layer stacked in this order on the substrate, wherein a growth temperature in a growth step of growing a Group II–VI compound semiconductor for formation of the cap layer is set lower than the growth temperature of the formation of the preceding layers in the growth step.

A yet another method for manufacturing a semiconductor light emitting device according to the present invention comprises the steps of:

irradiating corpuscular beams from a plurality of cells by opening and closing shutters within a vacuum container; and manufacturing the semiconductor light emitting device by growing a Group II–VI compound semiconductor layer comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), wherein before growing the Group II–VI compound semiconductor layer, at least one cell is heated and the temperature for heating the cell increases to the temperature higher than the temperature at which the Group II–VI compound semiconductor layer is grown.

In the semiconductor light emitting device according to the present invention, light emission occurs when current is injected from the p-side electrode into the active layer through the cap layer. Here, since the thickness of the cap layer is thin, or less than 10 nm, it is possible to prevent the carrier concentrations of other Group II–VI compound semiconductor layers from decreasing, while maintaining an ohmic contact with the p-side electrode. As a result, the operating voltage of the device is lowered, the caloric value is decreased and the life time of the element is extended.

In another semiconductor light emitting device according to the present invention, light emission occurs when current is injected from the p-side electrode into the active layer through the contact layer. Since the p-type impurity concentration of the contact layer falls within a predetermined range, the carrier concentration of the contact layer increases.

In yet another semiconductor light emitting device according to the present invention, light emission occurs when current is injected from the p-side electrode into the active layer through the contact layer and the backing layer. Since the p-type impurity concentration of the backing layer falls within a predetermined range, the carrier concentration of the backing layer increases and deterioration in other Group II–VI compound semiconductor layers, such as the contact layer, are prevented.

In the method for manufacturing a semiconductor light emitting device according to the present invention, corpuscular beams are irradiated onto the substrate and a plurality of Group II–VI compound semiconductor layers corresponding to the n-type cladding layer, the active layer, the p-type cladding layer, the backing layer and the contact layer are grown on the substrate. The growth temperature in the growth step of the Group II–VI compound semiconductor layer after the formation of the backing layer is set lower than that in the growth step of the Group II–VI compound semiconductor layers before the formation of the backing layer.

In another method for manufacturing a semiconductor light emitting device according to the present invention, corpuscular beams are irradiated onto the substrate and a plurality of Group II–VI compound semiconductor layers corresponding to the n-type cladding layer, the active layer, the p-type cladding layer, the backing layer and the contact layer are grown on the substrate. At this time, the temperature in the growth step of growing Group II–VI compound semiconductor layers after the formation of the backing layer is set lower than that in the growth step of growing the Group II–VI compound semiconductor layers before the formation of the backing layer.

In yet another method for manufacturing a semiconductor light emitting device according to the present invention, corpuscular beams are irradiated onto the substrate and a plurality of Group II–VI compound semiconductor layers corresponding to the n-type cladding layer, the active layer, the p-type cladding layer, the backing layer, the contact layer and the cap layer are grown on the substrate. At this time, the temperature in the growth step of growing the Group II–VI compound semiconductor layer for the formation of the cap layer is set lower than that in the growth step of growing the Group II–VI compound semiconductor layers before the formation of the cap layer.

In yet another method for manufacturing a semiconductor light emitting device according to the present invention, corpuscular beams are irradiated from a plurality of cells, respectively to thereby grow Group II–VI compound semiconductor layers. In this case, before the Group II–VI compound semiconductor layers are grown, at least one of the cells is heated up to the temperature higher than that when the Group II–VI compound semiconductor layers are grown.

Other and further objects, features and advantages of the invention will appear more fully from the following description.

DETAILED DESCRIPTION OF THE PREFERRED EMBODIMENTS

Embodiments of the present invention will now be described in detail with reference to the drawings.

Figure 1:
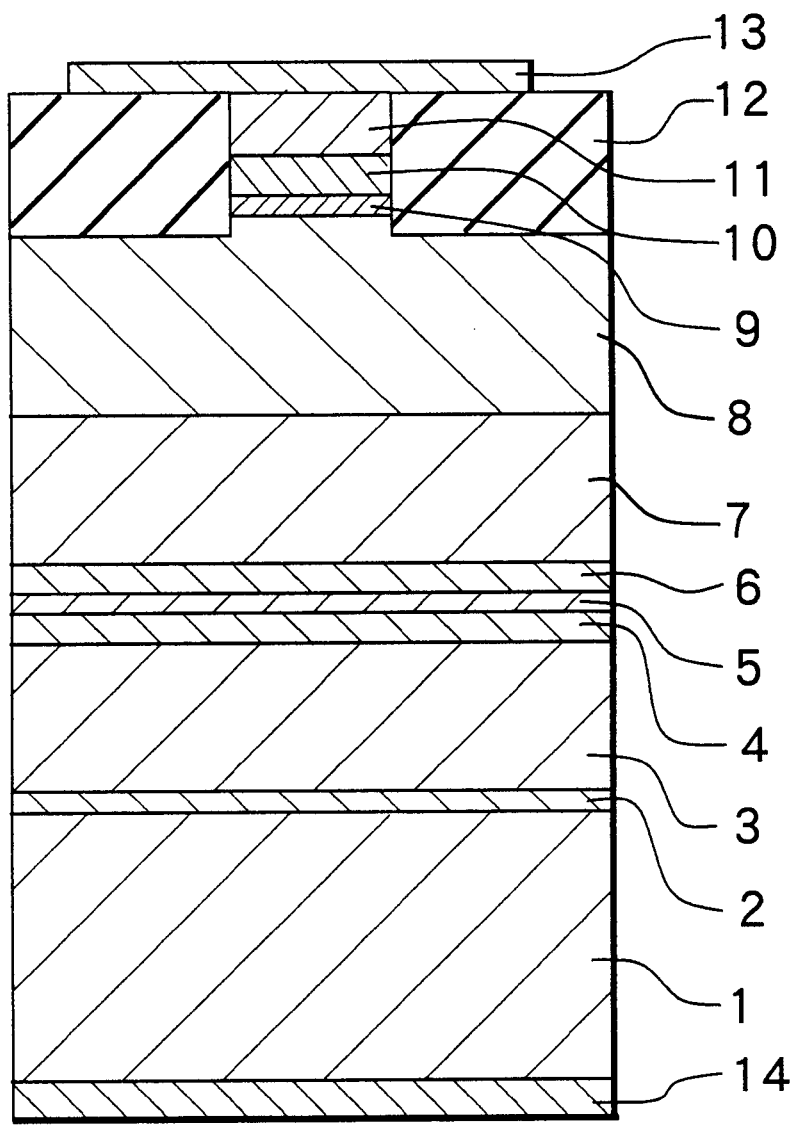
FIG. 1 is a cross-sectional view showing the structure of a semiconductor light emitting device in the first embodiment according to the present invention.

FIG. 1 shows a structure of a semiconductor light emitting device in the first embodiment according to the present invention. The semiconductor light emitting device comprising a buffer layer 2, an n-type cladding layer 3, a first guiding layer 4, an active layer 5, a second guiding layer 6, a p-type cladding layer 7, a backing layer 8, a contact layer 9, a superlattice layer 10 and a cap layer 11 serving as Group II–VI compound semiconductor layers are stacked in this order respectively on a substrate 1.

The substrate 1, for example, has a stacking direction thickness (to be referred to simply as "thickness" hereinafter) of 100 to 350 µm and comprises n-type GaAs to which silicon (Si) is added as n-type impurities. The buffer layer 2, for example, has a thickness of 10 nm and comprises n-type ZnSe to which chlorine (Cl) is added as n-type impurities. The n-type cladding layer 3, for example, has a thickness of 1 µm and comprising n-type ZnMgSSe mixed crystal to which chlorine (Cl) is added as n-type impurities.

The first guiding layer 4, for example, has a thickness of 100 nm and comprises ZnSSe mixed crystal to which chlorine is added as n-type impurities or no impurities are added. The Group VI elements in the ZnSSe mixed crystal contains 6% of sulfur and 94% of selenium and the lattice constant thereof matches with that of GaAs included in the substrate 1.

The active layer 5, for example, comprises ZnCdSe mixed crystal having a single quantum well structure and having thickness of 3 to 4 nm. The Group II elements in the mixed crystal of ZnCdSe contains 75% of zinc and 25% of cadmium and the lattice constant thereof is slightly larger than that of GaAs included in the substrate 1.

The second guiding layer 6, for example, has a thickness of 100 nm and comprises ZnSSe mixed crystal to which nitrogen (N) is added as p-type impurities or no impurities are added. The Group VI elements in the ZnSSe mixed crystal contains 6% of sulfur and 94% of selenium. The ptype cladding layer 7 has, for example, a thickness of 1 µm and comprises p-type ZnMgSSe mixed crystal to which nitrogen (N) is added as p-type impurities.

The backing layer 8, for example, has a thickness of 1.5 µm and comprises p-type ZnSSe mixed crystal to which nitrogen is added as p-type impurities. The reason why the backing layer 8 comprises the ZnSSe mixed crystal is that the ZnSSe mixed crystal can be lattice-matched with GaAs of the substrate 1 to thereby have a sufficient thickness and that it can have a higher carrier concentration than that of the ZnMgSSe mixed crystal included in the p-type cladding layer 7 so that operating voltage can be lowered. The Group VI elements in the ZnSSe mixed crystal, therefore, preferably contains 6% of sulfur and 94% of selenium so that the lattice constant matches with that of GaAs of the substrate 1.

The concentration of nitrogen added to the backing layer 8 (i.e., p-type impurity addition concentration) is preferably within a range between $1\times10^{18}$ and $3\times10^{18}$ cm$^{-3}$. That is because a high carrier concentration can be realized within this range. It is noted to be that the carrier concentration becomes higher as the addition concentration increases until the added nitrogen concentration reaches a certain saturation, however, when the added nitrogen concentration exceeds the saturation, activation efficiency is lowered and the carrier concentration decreases accordingly. The range of the added nitrogen concentration differs from the range in which a carrier concentration increases in a case where a single mixed crystal of ZnSSe is grown on the substrate. The difference in range is considered to be due to the influence from other Group II–VI compound semiconductor layers. The carrier concentration of the backing layer 8 is preferably as high as in the range of about $0.5\times10^{18}$ to $1\times10^{18}$ cm$^{-3}$ in order to lower the operating voltage.

It is preferable that the added nitrogen concentration in the backing layer 8 is slightly higher than the saturation at which activation efficiency starts lowering. The backing layer 8, the contact layer 9, the superlattice layer 10 and the cap layer 11 are considered to deteriorate if light emitted from the active layer reaches the respective layers. By adding more nitrogen to the backing layer 8, the light and electrons from the active layer are prevented from leaking into the p-side electrode 13 rather than into the backing layer 8.

The contact layer 9, for example, has a thickness of 150 nm and comprises either p-type ZnSe mixed crystal or p-type ZnSSe mixed crystal to which nitrogen is added as p-type impurities. For reference, under the condition of the same concentration of added nitrogen, the ZnSe mixed crystal is preferable because it has a higher activation efficiency and carrier concentration than the ZnSSe mixed crystal has. The ZnSSe mixed crystal is thus preferable to have a lower sulfur composition ratio because in that way higher activation efficiency and carrier concentration can be obtained.

The ZnSe mixed crystal, however, lattice-mismatches with GaAs of the substrate 1 by 0.26%. The ZnSSe mixed crystal having a sulfur composition ratio of less than 6%, has lattice-mismatching with GaAs in proportion to the sulfur composition ratio. When contact layer 9 comprises ZnSe or ZnSSe mixed crystal, the thickness in the layer 9 is preferably thinner than that of a critical film, for example, 150 nm or less.

Figure 2:
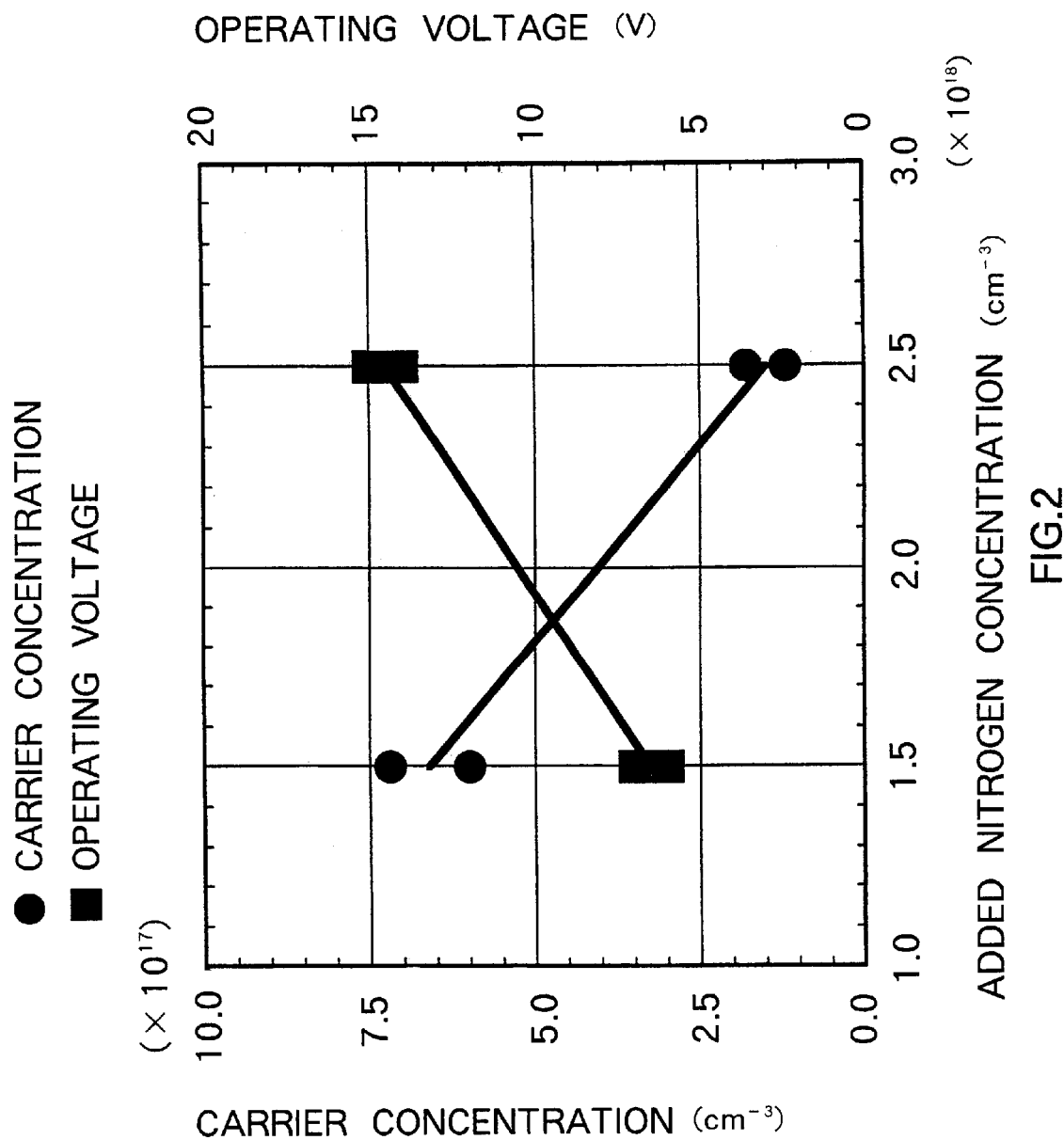
FIG. 2 is a characteristic view showing the relationship among added nitrogen concentration in the contact layer, carrier concentration thereof and the operating voltage of the semiconductor light emitting device.

The added nitrogen concentration in the contact layer 9 is preferably within the range between $1 \times 10^{18}$ and $2 \times 10^{18}$ cm$^{-3}$. That is because a higher carrier concentration can be realized within this range as in the case with the backing layer 8, which is described before. FIG. 2 shows the relationship among the added nitrogen concentration in the contact layer 9, the carrier concentration therein and the operating voltage of the semiconductor light emitting device. FIG. 2 is the result of an experiment under the following conditions. The n-type cladding layer 3 having a thickness of 1 μm and comprising ZnMgSSe mixed crystal, the first guiding layer 4 having a thickness of 100 nm and comprising ZnSSe mixed crystal, an active layer 5 having a thickness of 3 nm and comprising ZnCdSe mixed crystal, the second guiding layer 6 having a thickness of 100 nm and comprising ZnSSe mixed crystal, the p-type cladding layer 7 having a thickness of 1 μm and comprising p-type ZnMgSSe mixed crystal, the backing layer 8 having a thickness of 1.5 μm and comprising p-type ZnSSe mixed crystal and the contact layer 9 having a thickness of 150 nm and comprising ZnSe mixed crystal are stacked in this order on the substrate 1 of n-type GaAs through the buffer layer 2 having a thickness of 10 nm and comprising n-type ZnSe. The superlattice layer 10 formed by alternately stacking p-type ZnTe mixed crystal and p-type ZnSe mixed crystal, described later, and a cap layer 11 having a thickness of 4 nm and comprising p-type ZnTe mixed crystal are sequentially stacked on the resultant layer to thereby provide a semiconductor light emitting device. The experiment was conducted to the semiconductor light emitting device by varying the added nitrogen concentration in the contact layer 9.

As shown in FIG. 2, if the added nitrogen concentration in the contact layer 9 increases from $1.5 \times 10^{18}$ cm$^{-3}$ to $2.5 \times 10^{18}$ cm$^{-3}$, the carrier concentration of the contact layer 9 decreases as indicated by round marks and the operating voltage of the semiconductor light emitting device increases as indicated by box marks therein. For reference, when only ZnSe is grown on the substrate (not shown) carrier concentration is as high as about $1 \times 10^{18}$ cm$^{-3}$ while the added nitrogen concentration is in the range between $2.5 \times 10^{18}$ and $3 \times 10^{18}$ cm$^{-3}$. In other words, unlike when only ZnSe is grown on the substrate, comprising a single layer, the contact layer 9 of the semiconductor light emitting device formed by stacking a plurality of Group II–VI compound semiconductor layers has a high carrier concentration approximately in the range between $0.5 \times 10^{18}$ cm$^{-3}$ and $1 \times 10^{18}$ cm$^{-3}$ while the added nitrogen concentration thereof is in the range of $1 \times 10^{18}$ to $2 \times 10^{18}$ cm$^{-3}$. The carrier concentration of the contact layer 9 is preferably as high as about $0.5 \times 10^{18}$ to $1 \times 10^{18}$ cm$^{-3}$ in order to lower the operating voltage of the device.

The added nitrogen concentration of the contact layer 9 is, unlike the backing layer 8, preferably not higher than the saturation concentration to have a highest carrier concentration. That is because the contact layer 9 is thin and cannot very much expect the effect of preventing the leakage of light and electrons unlike the backing layer 8 and it is preferable rather to increase the carrier concentration and to thereby decrease resistance. Comparing the backing layer 8 with the contact layer 9, therefore, the added nitrogen concentration of the backing layer 8 is higher than that of the contact layer 9.

The superlattice layer 10 is formed by alternately stacking p-type ZnSe, to which nitrogen is added as p-type impurities, and p-type ZnTe to which nitrogen is added as p-type impurities. The superlattice layer 10 is intended to decrease resistance caused by discontinuity in valence band between ZnSe of the contact layer 9 and ZnTe or the like of the cap layer 11, described later, and to thereby lower the operating voltage of the device.

The cap layer 11, for example, has a thickness of not less than 1 atomic layer (about 0.28 nm) and less than 10 nm, and comprises p-type ZnTe to which nitrogen is added as p-type impurities. The reason why the cap layer 11 comprises ZnTe is that ZnTe can have a high carrier concentration enough to maintain an ohmic contact with the p-side electrode. The reason why the cap layer 11 is set less than 10 nm is as follows. Due to 7.7% lattice mismatching between the ZnTe of the cap layer 11 and ZnSe of the contact layer 9, when the cap layer 11 is thick, transition or the like occurs frequently and crystallinity of cap layer 11 deteriorates accordingly. In addition thereto, stress is applied to the contact layer 9 and the nitrogen activation efficiency in the contact layer 9 is lowered, which causes the operating voltage of the device to increase.

Figure 3:
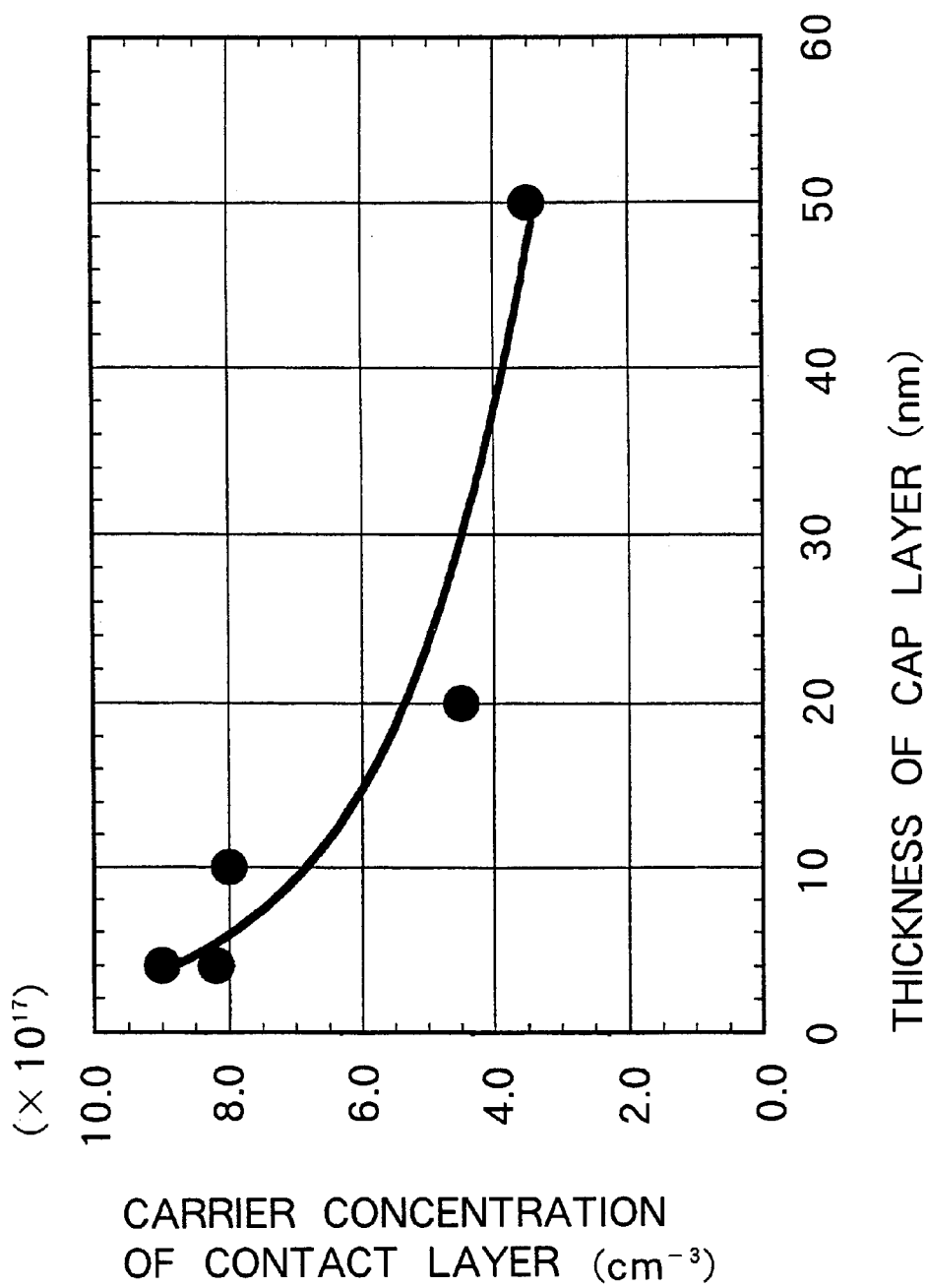
FIG. 3 is a characteristic view showing the relationship between the thickness of the cap layer and the carrier concentration of the contact layer.

FIG. 3 shows the relationship between the thickness of the cap layer 11 and the carrier concentration of the contact layer 9. FIG. 3 is the result of an experiment which was conducted with respect to a semiconductor light emitting device similar to that used in the experiment shown in FIG. 2. In the experiment, while the added nitrogen concentration of the contact layer 9 was kept constant, the thickness of the cap layer 11 was variously changed in the semiconductor light emitting device. As can be seen from FIG. 3, the thicker the cap layer is, the lower the carrier concentration of the contact layer 9 becomes. The thickness of the cap layer 11 is, in particular, preferably less than 10 nm, because the carrier concentration of the contact layer 9 can be increased to not less than $7 \times 10^{17}$ cm$^{-3}$.

The contact layer 9, the superlattice layer 10 and the cap layer 11 are of band shape having a thickness of, for example, 10 μm. They are intended to stenose current. An insulating layer 12 made of, for example, polyimide is formed on the region of the backing layer 8 on which the contact layer 9, the superlattice layer 10 and the cap layer 11 are not formed.

A p-side electrode 13 is formed by stacking palladium (Pd), platinum (Pt) and gold (Au) in this order from the side of the cap layer 11 on the insulating layer 12 and the cap layer 11. The p-side electrode 13 is electrically connected to the p-type cladding layer 7 through the cap layer 11, the superlattice layer 10, the contact layer 9 and the backing layer 8. An n-side electrode 14 formed of, for example, indium (In) is provided on the back surface of the substrate 1 and is electrically connected to the n-type cladding layer 3 through the substrate 1 and the buffer layer 2.

Although not shown, the semiconductor light emitting device has reflecting mirror layers on a pair of side surfaces perpendicular to the longitudinal direction of the cap layer 11 (that is, the longitudinal direction of a resonator). Each reflecting mirror layer is formed by, for example, alternately stacking an alumina film and a silicon film.

The semiconductor light emitting device with such a structure can be manufactured as follows.

Description here will be given to a case where Group II–VI compound semiconductor layers corresponding to the buffer layer 2, the n-type cladding layer 3, the first guiding layer 4, the active layer 5, the second guiding layer 6, the p-type cladding layer 7, the backing layer 8, the contact layer 9, the superlattice layer 10 and the cap layer 11, respectively, are grown by the Molecular Beam Epitaxy, or MBE method.

Figure 4:
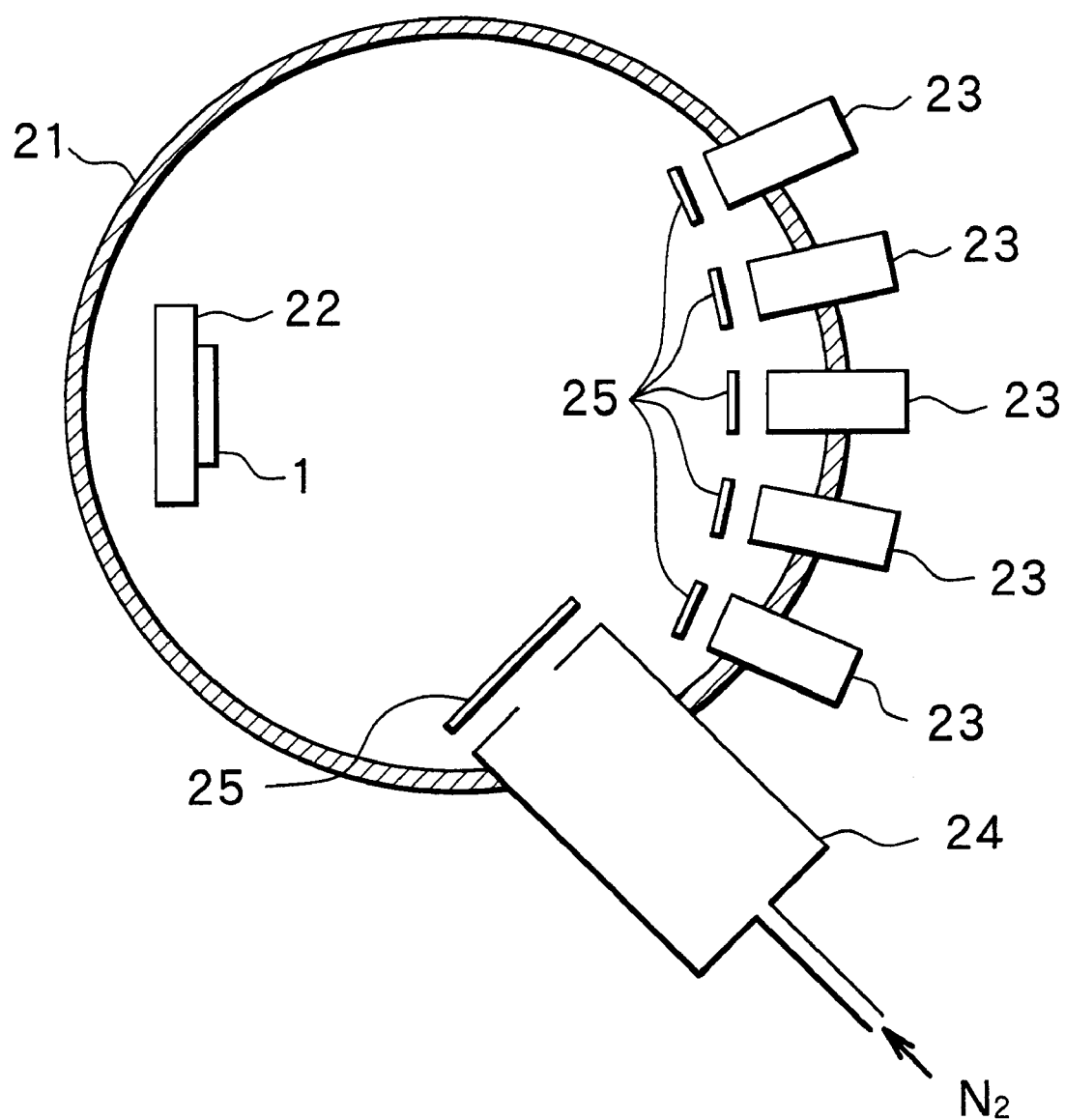
FIG. 4 is a block diagram showing an MBE system for use in the manufacture of the semiconductor light emitting device shown in FIG. 1.

First, an MBE system for growing respective Group II–VI compound semiconductor layers is prepared. FIG. 4 shows the structure of the MBE system used in this case. The MBE system comprises a vacuum container 21 having a substrate holder 22 for holding the substrate 1 provided inside thereof. The vacuum container 21 is provided with a plurality of corpuscular beam source cells 23 arranged opposite to the substrate 1. The Knudsen cells (K cells) or bulb cells, for example, are used for the corpuscular beam source cells 23. K cells are used when the material is solid, whereas the bulb cells are used when the material is liquid. The vacuum container 21 is also provided with a plasma generating chamber 24 for generating plasma out of nitrogen and irradiating the plasma toward the substrate 1. The plasma generating chamber 24 comprises, for example, ECR (Electron Cyclotron Resonance) cells and RF (Radio Frequency) cells. Shutters 25 are provided in the vicinity of irradiation ports of the corpuscular beam source cells 23 and the plasma generating chamber 24, respectively. The irradiation of each of the corpuscular beam source cells is controlled by opening/closing each shutter 25.

Before forming the respective Group II–VI compound semiconductor layers using the MBE system, each of the corpuscular beam source cells 23 is once heated to a temperature higher than the temperature at which each of the Group II–VI compound semiconductor layers is grown and the material attached to the back side of each shutter 25 is splashed (the cell heating step). The reason of conducting the cell heating step is as follows. It is inevitable that the corresponding material is attached to the back side of the corresponding shutter 25 in the growing process of each of the Group II–VI compound semiconductor layers. Therefore, if the process proceeds to the next growth step in the state, the material which is not desired to be supplied is splashed from the back sides of the shutters 25 by heating the corpuscular beam source cells 23 and taken in the Group II–VI compound semiconductor layer, as impurities. As a result, the crystallinity and the carrier concentration of each of the Group II–VI compound semiconductor layers are lowered. If tellurium is contained while growing the backing layer 8 and the contact layer 9, in particular, the carrier concentrations of the layers 8 and 9 unfavorably decrease. Accordingly, it is necessary to heat at least the tellurium corpuscular beam source cell 23 before conducting the growth step.

Figure 5:
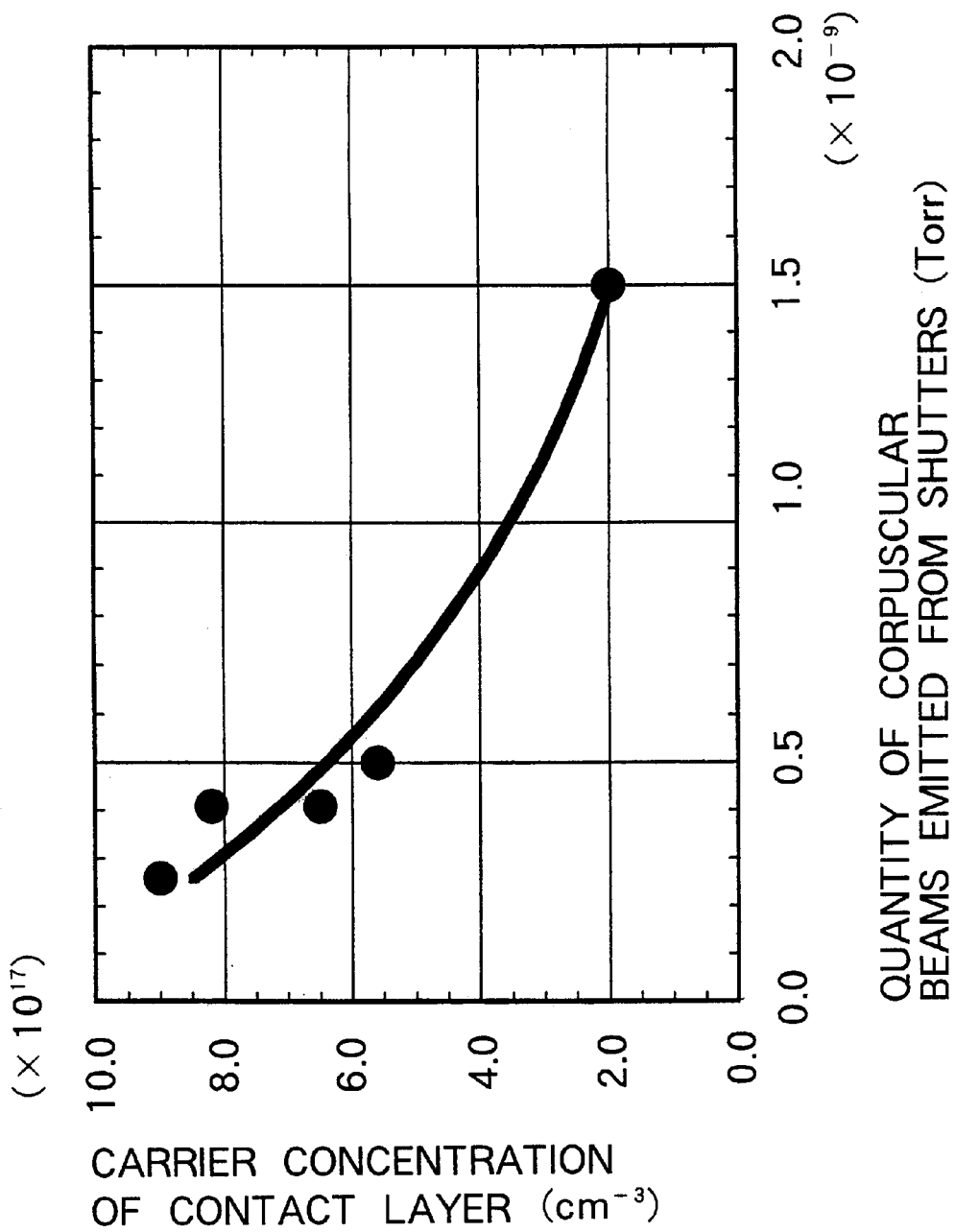
FIG. 5 is a characteristic view showing the relationship between the atmosphere in the cell heating step and the carrier concentration of the contact layer.

In doing it, it is preferable that the corpuscular beam source cells 23 are heated satisfactorily until the quantity of the corpuscular beams emitted from the back sides of the shutters 25 becomes $1 \times 10^{-9}$ Torr or less in an atmosphere within the vacuum container 21. FIG. 5 shows the relationship between the quantity of corpuscular beams emitted from shutters 25 (measured in the atmosphere within the vacuum container 21) and the carrier concentration of the contact layer 9. FIG. 5 is the result of an experiment in which a semiconductor light emitting device similar to that used in the experiment shown in FIG. 2 was formed while the added nitrogen concentration of the contact layer 9 was kept constant. As can be seen from FIG. 5, as the corpuscular beams emitted from the shutters 25 in the cell heating step become less in quantity, the nitrogen activation efficiency in the contact layer 9 and the carrier concentration thereof further increase. If the corpuscular beam source cells 23 are, in particular, sufficiently heated until the quantity of the corpuscular beams emitted from the back sides of the shutters 25 becomes $1 \times 10^{-9}$ Torr or less in the atmosphere within the vacuum container 21, then the carrier concentration of the contact layer 9 can be desirably increased to $3 \times 10^{17}$ cm$^{-3}$ or more.

After the corpuscular beam source cells 23 have been thus heated, the corpuscular beams of the materials are appropriately irradiated from each of the corpuscular beam source cells 23 in accordance with the corresponding one of the Group II–VI compound semiconductor layers to be grown, using the MBE system shown in FIG. 4, so that respective Group II–VI compound semiconductor layers are sequentially epitaxially grown on the substrate 1 (the growth step). In the process, chlorine is added to the buffer layer 2, the n-type cladding layer 3 and the first guiding layer 4, respectively by irradiating the corpuscular beams of chlorine, together with the corpuscular beams of the materials, from the corpuscular beam source cells 23. Nitrogen is added to the second guiding layer 6, the p-type cladding layer 7, the backing layer 8, the contact layer 9, the superlattice layer 10 and the cap layer 11, respectively, by irradiating nitrogen which has turned into plasma in the plasma generating chamber 24 in addition to the respective corpuscular beams of the materials.

When the respective Group II–VI compound semiconductor layers are grown, it is preferable that the temperatures at which the backing layer 8 and the following or upper layers (i.e., the backing layer 8, the contact layer 9, the superlattice layer 10 and the cap layer 11) are formed in the growth step, are set to be lower than the temperature at which the layers preceding the backing layer 8 (i.e., the buffer layer 2, the n-type cladding layer 3, the first guiding layer 4, the active layer 5, the second guiding layer 6 and the p-type cladding layer) are formed in the growth step. The reason is as follows. The Group II–VI compound semiconductor layers which have been grown earlier continue to be heated at the growth temperature for several hours until the growth of the remaining Group II–VI compound semiconductor layers is completed. As a result, the carrier concentrations of the p-type Group II–VI compound semiconductor layers to which nitrogen is added, in particular, decrease. For reference, the respective Group II–VI compound semiconductor layers are generally grown at a growth temperature of about 280° C.

Figure 6:
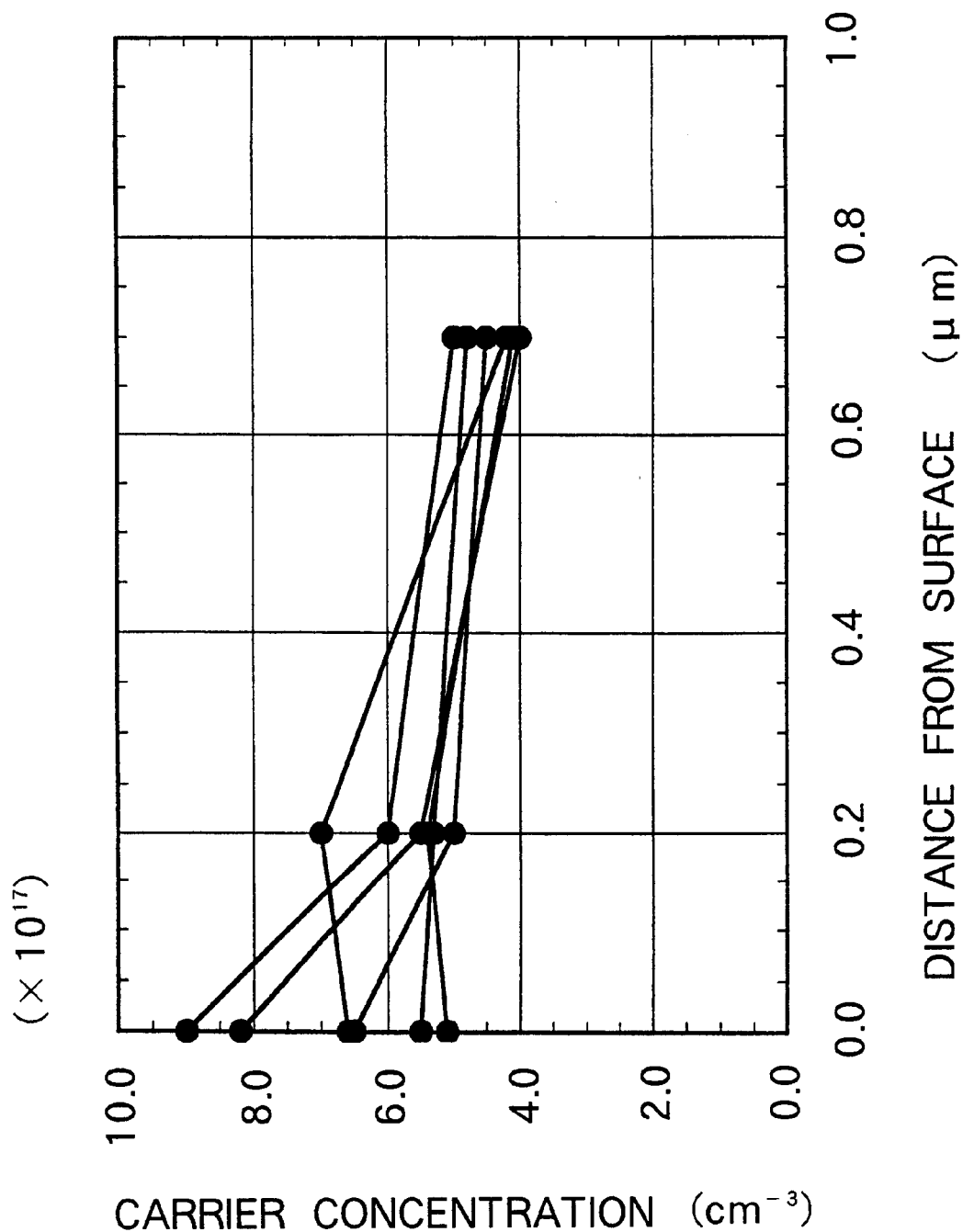
FIG. 6 is a characteristic view showing the relationship between the distance from the surface and carrier concentration.

FIG. 6 shows the relationship between the distance from the surface and the carrier concentration when a plurality of p-type ZnSSe mixed crystal, to which nitrogen is added as p-type impurities, are grown at a given growth temperature 280° C., respectively. As shown therein, every crystal is more affected by the heating with distance from the surface (that is, the earlier the crystal are grown, the more affected), and the nitrogen activation efficiency and carrier concentrations decrease. In other words, when the backing layer 8, the contact layer 9, the superlattice layer 10 and the cap layer 11 which need to have higher carrier concentrations are to be grown, it is better to decrease the growth temperature to thereby prevent carrier concentrations from decreasing by heating.

The growth temperature at which the backing layer 8 and the following layers are formed is preferably set lower than that at which the layers preceding the backing layer 8 are formed, by 15° C. to 80° C. The reason is as follows. Unless the temperature of the former is lower than that of the latter by 15° C. or more, it is impossible to sufficiently prevent carrier concentration from decreasing by heating. In addition, if the temperature of the former is lower than that of the latter by 80° C. or more, it is impossible to grow a single crystal having good crystallinity. The growth temperature may be, for example, the temperature at which the substrate 1 is formed.

In this example, the growth temperature at which the backing layer 8 and the following, or upper layers are formed is set lower than that at which the layers preceding the backing layer 8 are formed. However, in the growth step, the growth temperature at which the layers following the backing layer 8 (i.e., the contact layer 9, the superlattice layer 10 and the cap layer 11) are formed, may be set lower than that at which backing layer 8 and the preceding layers (i.e., the buffer layer 2, the n-type cladding layer 3, the first guiding layer 4, the active layer 5, the second guiding layer 6, the p-type cladding layer 7 and the backing layer 8) are formed. Furthermore, the growth temperature at which the cap layer 11 is formed in the growth step may be set lower than that at which the preceding layers, or lower layers than the cap layer 11 are formed in the growth step.

After growing the Group II–VI compound semiconductor layers as described above, a resist film (not shown) is coated on the cap layer 11 and a plurality of parallel and band-shaped mask patterns are formed by means of photolithography. Thereafter, while the resist film (not shown) is used as a mask, wet etching or dry etching is conducted. The cap layer 11, the super lattice layer 10 and the contact layer 9 are thus selectively removed to be made in a plurality of parallel, band-shapes. Next, an insulating material such as polyimide is coated on the entire surface (i.e., the surface region of the backing layer 8 from which the cap layer 11 and the like are selectively removed and the surface region on the resist film (not shown)). Then, the resist film (not shown) together with the insulating material deposited on the resist film is removed (or lifted off) to form the insulating layer 12 (the current stenosis step).

Thereafter, palladium, platinum and gold, for example, are sequentially deposited on the cap layer 11 and the insulating layer 12 to form the p-side electrode 13. In addition, for example, indium is deposited on the back surface of the substrate 1 to form the n-side electrode 14 (the electrode formation step).

After forming the p-side electrode 13 and the n-side electrode 14, the substrate 1 is cleaved perpendicular to the longitudinal direction (or the longitudinal direction of the resonance) of the cap layer 11 so that each of the cleaved parts have a predetermined width (such as 600 nm width), and a reflecting mirror surface is formed on each of the cleavage planes. Portions among a plurality of band-shaped cap layers 11 thus formed are cleaved parallel to the longitudinal direction of the cap layer 11 (the cleavage step). As a result, a semiconductor light emitting device is formed as shown in FIG. 1.

The semiconductor light emitting device thus manufactured functions as follows.

In the semiconductor light emitting device, when predetermined voltage is applied between the n-side electrode 14 and the p-side electrode 13, current is injected from the p-side electrode 13 into the active layer 5 through the cap layer 11, the superlattice layer 10, the contact layer 9, the backing layer 8 and the p-type cladding layer 7. In the active layer 5, light emission occurs due to electron-hole recombination. Since the cap layer 11 is thin less than 10 nm, a decrease in the carrier concentration of the contact layer 12 or the like is prevented while an ohmic contact with the pside electrode 13 is being maintained. Since the added nitrogen concentration of the contact layer 9 falls within the predetermined range, the carrier concentration thereof increases. Besides, since the added nitrogen concentration of the backing layer 8 falls within the predetermined range, the carrier concentration of the backing layer 8 increases and the contact layer 9 or the like is thereby prevented from deteriorating. As a result, the operating voltage of the device is lowered, the calorific value decreases and the life time of the element is extended.

Figure 7:
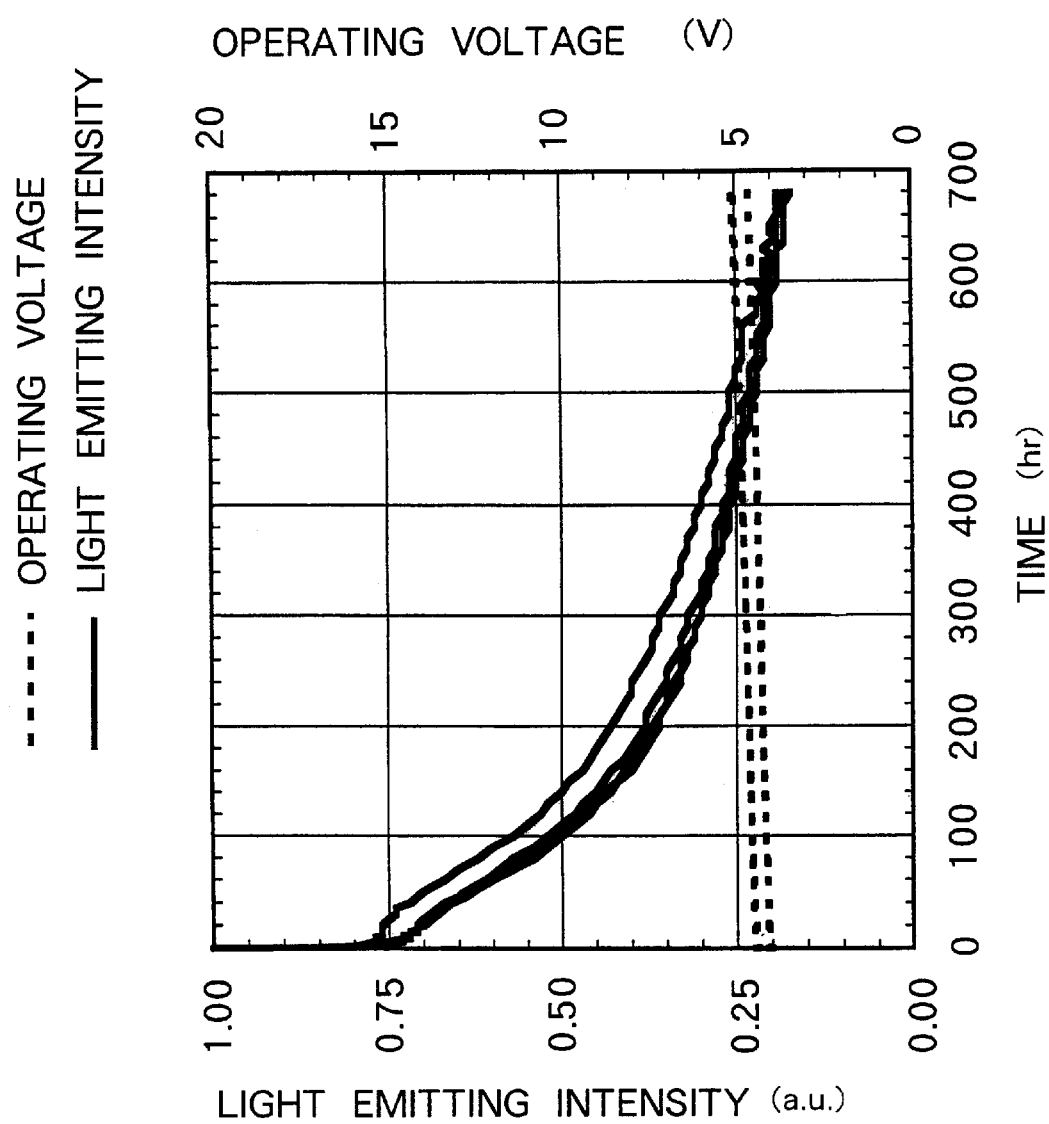
FIG. 7 is a characteristic view showing changes in the operating voltage and in light emission intensity in case of using the semiconductor light emitting device shown in FIG. 1.

To confirm the advantages or effects of the semiconductor light emitting device in this embodiment according to the present invention, the relationship between changes in operating voltage of the device and changes in light emission intensity was examined. FIG. 7 shows the result of the experiment. In FIG. 7, a broken line denotes operating voltage and a solid line denotes light emission intensity.

FIG. 7 represents results of a plurality of semiconductor light emitting devices which are simultaneously grown on a single substrate. As shown, the semiconductor light emitting devices in this embodiment according to the present invention have operating voltage of 5 V or less even after 600 hours elapsed and can sufficiently operate. After 100 hours elapsed, the device can have light emission intensity of about 0.5 a.u. Compared with the conventional semiconductor light emitting device which makes operating voltage increase in several hours and then cannot operate thereafter, the life time of the semiconductor light emitting device in this embodiment is extended considerably.

According to the semiconductor light emitting device in this embodiment, the cap layer 11 is thin, or less than 10 nm. Due to this, it is possible to prevent the carrier concentration of, for example, the contact layer 9 or the like from decreasing, while maintaining an ohmic contact with the p-side electrode 13. As a result, it is possible to lower the operating voltage of the device, to decrease the caloric value and to extend the service life of the element.

Moreover, according to the semiconductor light emitting device in this embodiment, since nitrogen in concentration between $1\times10^{18}$ and $2\times10^{18}$ cm$^{-3}$ is added to the contact layer 9, the carrier concentration of the contact layer 9 can thereby increase. As a result, it is possible to lower the operating voltage further and to decrease the caloric value further, which makes it possible to extend the life time of the element further.

In addition, according to the semiconductor light emitting device in this embodiment, nitrogen in concentration between $1\times10^{18}$ and $3\times10^{18}$ cm$^{-3}$ is added to the backing layer 8. Due to this, it is possible to increase the carrier concentration of the backing layer 8 and, at the same time, to prevent light and electrons from leaking from the active layer 5 by adding excessive nitrogen, and to prevent other Group II–VI compound semiconductor layers, such as the contact layer 9, from deteriorating. As a result, it is possible to lower the operating voltage of the device further and to decrease the caloric value further, which allows to extend the life time of the element further.

According to the method for manufacturing the semiconductor light emitting device in this embodiment, the growth temperature, at which the backing layer 8 and the following layers, or upper layers are formed in the growth step, is set lower than that of the formation of the preceding layers, or lower layers than the backing layer 8 in the growth step. The growth temperature after the formation of the backing layer 8 in the growth step is set lower than that at which the backing layer 8 and the preceding layers, or lower layers than the backing layer 8 are formed in the growth step.

The growth temperature at which the cap layer 11 is formed in the growth step is set lower than that at which the preceding layers, or lower layers than the cap layer 11 is formed in the growth step. Due to them, it is possible to prevent nitrogen activation efficiency from degrading in each of the backing layer 8, the contact layer 9, the superlattice layer 10 and the cap layer 11, and then to prevent their carrier concentrations from decreasing. The carrier concentrations of the backing layer 8 and of the contact layer 9 can be increased up to about $0.5 \times 10^{18}$ to $1 \times 10^{18}$ cm$^{-3}$. As a result, it is possible to lower the operating voltage of the semiconductor light emitting device. At the same time, the caloric value can be decreased and the life time of the element can be extended.

In addition, according to the method for manufacturing semiconductor light emitting device in this embodiment, before the Group II–VI compound semiconductor layers are grown, respectively, the temperature of at least one of the corpuscular beam cells 23 is increased to the temperature higher than that when the Group II–VI compound semiconductor layers are grown. Due to this, it is possible to improve the crystallinity of each Group II–VI compound semiconductor layer. It is possible, in particular, to prevent the nitrogen activation efficiencies of the backing layer 8 and of the contact layer 9 from degrading and to prevent their carrier concentrations from decreasing. As a result, the carrier concentrations of the backing layer 8 and the contact layer 9 can be increased up to about $0.5 \times 10^{18}$ to $1 \times 10^{18}$ cm$^{-3}$.

[Second Embodiment]

Figure 8:
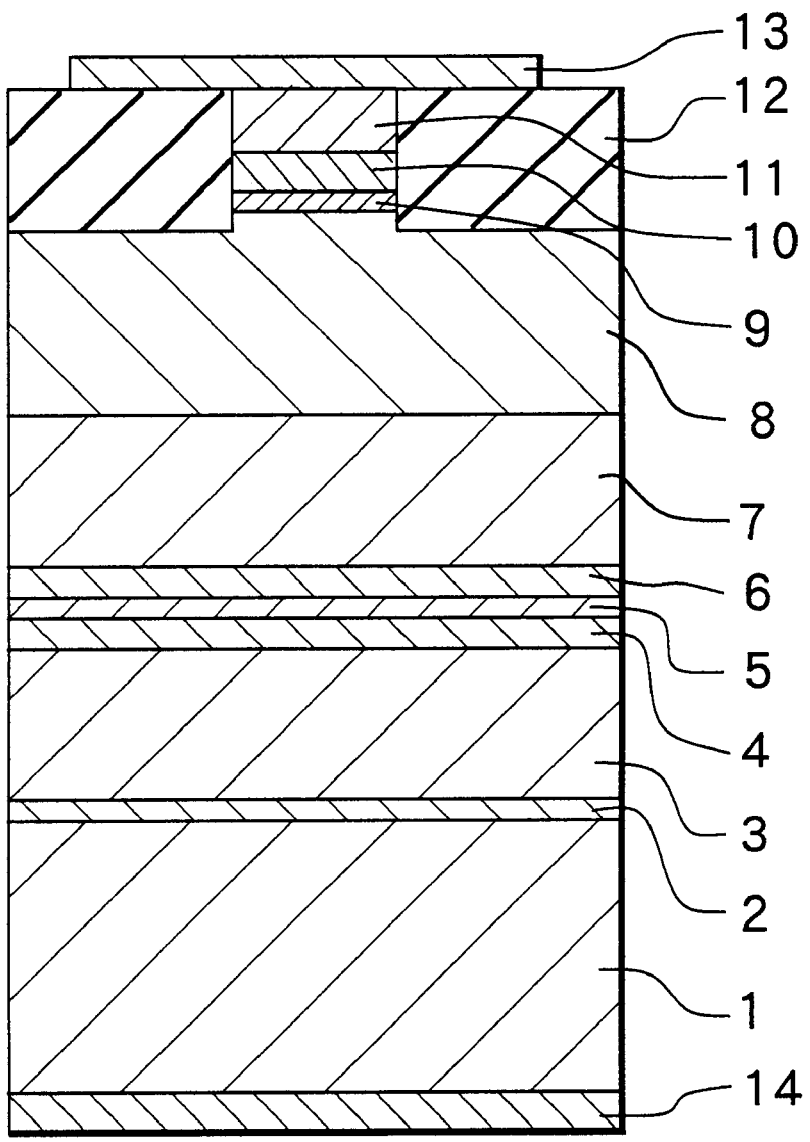
FIG. 8 is a cross-sectional view showing the structure of a semiconductor light emitting device in the second embodiment according to the present invention.

FIG. 8 shows a semiconductor light emitting device in a second embodiment according to the present invention. The second embodiment specifically illustrates a case, different from the first embodiment, of Group II–VI compound semiconductor layers composing the buffer layer 2, the n-type cladding layer 3, the first guiding layer 4, the active layer 5, the second guiding layer 6, the p-type cladding layer 7, the backing layer 8, the contact layer 9, the superlattice layer 10 and the cap layer 11, respectively. Same elements as in the first embodiment are denoted by the same reference numerals and their detailed descriptions will not be given herein.

The buffer layer 2 comprises, for example, n-type ZnBeSe mixed crystal to which chlorine is added as n-type impurities or n-type ZnSe to which chlorine is added as n-type impurities. The n-type cladding layer 3 comprises, for example, n-type ZnMgBeSe mixed crystal to which chlorine is added as n-type impurities. The first guiding layer 4 comprises, for example, ZnBeSe mixed crystal to which chlorine is added as n-type impurities or no impurities is added. The second guiding layer 6 comprises, for example, ZnBeSe mixed crystal to which nitrogen is added as p-type impurities or no impurities are added. The p-type cladding layer 7 comprises, for example, p-type ZnMgBeSe mixed crystal to which nitrogen is added as p-type impurities.

The backing layer 8 comprises, for example, p-type ZnBeSe mixed crystal to which nitrogen is added as p-type impurities. The reason why the backing layer 8 comprises ZnBeSe mixed crystal is, as in the case of the ZnSSe mixed crystal in the first embodiment, to lattice-match with GaAs included in the substrate 1 and to allow the backing layer 8 to have a higher carrier concentration than that of ZnMgBeSe mixed crystal included in the p-type cladding layer 7.

The contact layer 9 comprises, for example, p-type ZnSe to which nitrogen is added as p-type impurities or p-type ZnBeSe mixed crystal to which nitrogen is added as p-type impurities. Under the condition that the added nitrogen concentrations are the same, the layer 9 of ZnSe mixed crystal can have a higher activation efficiency and a higher carrier concentration than the layer 9 of ZnBeSe mixed crystal. When the composition ratio of beryllium is lower, the contact layer 9 of ZnBeSe mixed crystal can have desirably a higher activation efficiency and a higher carrier concentration. When the contact layer 9, however, comprises ZnSe mixed crystal or ZnBeSe mixed crystal which lattice mismatches with that of GaAs included in the substrate 1, it is preferable that the layer 9 is thinner than a critical film, for example, 150 nm or less.

The superlattice layer 10 has a structure, for example, in which p-type ZnSe mixed crystal to which nitrogen is added as p-type impurities and p-type BeTe to which nitrogen is added as p-type impurities are alternately stacked. The cap layer 11 comprises, for example, p-type BeTe mixed crystal to which nitrogen is added as p-type impurities. The reason why the cap layer 11 comprises BeTe mixed crystal is, as in the case of ZnTe mixed crystal in the first embodiment, to allow the layer 11 to have a high carrier concentration enough to make an ohmic contact with the p-side electrode 13.

The semiconductor light emitting device with such a structure can be manufactured in the same manner as in the first embodiment and have the same functions as those in the first embodiment. Namely, even with the structures of Group II–VI compound semiconductor layers appropriately varying, provided that the cap layer 11 is thin, or less than 10 nm or the added nitrogen concentrations of the contact layer 9 and the backing layer 8 fall within predetermined ranges, the semiconductor light emitting device in the second embodiment can have the same advantages or effects as those in the first embodiment. Besides, provided that corpuscular beam cells 23 are heated before the respective Group II–VI compound semiconductor layers are formed and the growth temperature is set lower before the backing layer 8 is formed, the method for manufacturing semiconductor light emitting device in the second embodiment can have the same advantages or effects as those in the first embodiment.

The present invention has been described so far, while referring to the first and second embodiment. It is to be noted that the present invention should not be limited to the above embodiments and various modifications could be made.

In each of the above embodiments, for example, the Group II–VI compound semiconductors which compose the buffer layer 2, the n-type cladding layer 3, the first guiding layer 4, the active layer 5, the second guiding layer 6, the p-type cladding layer 7, the backing layer 8, the contact layer 9, the superlattice layer 10 and the cap layer 11, respectively, have been described, while citing specific examples. In the present invention, it is possible to provide layers comprising other appropriate Group II–VI compound semiconductors (i.e., Group II–VI compound semiconductors containing at least one element of Group II selected from zinc, magnesium, cadmium, manganese, mercury and beryllium and at least one element of Group VI selected from oxygen, selenium, sulfur and tellurium).

In each of the above-stated embodiments, description has been given to the semiconductor light emitting device having a structure in which the active layer 5 is sandwiched between the guiding layers 4 and 6 and the active layer 5 thus sandwiched is further sandwiched between the cladding layers 3 and 7. The present invention is applicable to a semiconductor light emitting device having a structure in which an active layer is sandwiched between cladding layers without guiding layers inserted.

Moreover, in each of the above-stated embodiments, description has been given to a case where current is stenosed by, for example, band-shaped cap layer 11 or the like. The present invention also includes a case where current is stenosed by other structures.

Additionally, each of the above-stated embodiments has illustrated a case where the Group II–VI compound semiconductor layers are grown on the substrate 1, respectively, by the solid source MBE method. The layers may be grown by, for example, the gas source MBE method or the Metal Organic Chemical Vapor Deposition, or MOCVD method.

As described above, according to the semiconductor light emitting device of the present invention, the thickness of the cap layer is less than 10 nm. Due to this, while maintaining an ohmic contact with the p-side electrode, it is possible to prevent the carrier concentrations of other Group II–VI compound semiconductor layers from decreasing. As a result, the present invention has the following advantages. Namely, the operating voltage of the device can be lowered, the caloric value can be decreased and the longer life time of the device can be ensured.

According to another semiconductor light emitting device of the present invention, nitrogen in the concentration which falls within a range between $1 \times 10^{18}$ and $2 \times 10^{18}$ cm$^{-3}$ is added to the contact layer. This makes it possible to increase the carrier concentration of the contact layer. As a result, the present invention has the following advantages. Namely, the operating voltage of the device can be lowered, the caloric value can de decreased and the life time of the device can be extended.

According to yet another semiconductor light emitting device of the present invention, nitrogen in the concentration which falls within a range between $1 \times 10^{18}$ and $3 \times 10^{18}$ cm$^{-3}$ is added to the backing layer. This makes it possible to increase the carrier concentration of the backing layer, to prevent light and electrons from leaking from the active layer by adding excessive nitrogen, and to prevent other Group II–VI compound semiconductor layers from deteriorating. As a result, the present invention has the following advantages. Namely, the operating voltage of the device can be lowered, the caloric value can be decreased and the life time of the device can be extended.

Furthermore, according to the method for manufacturing semiconductor light emitting device of the present invention, the growth temperature at which the backing layer and the following, or upper layers are formed in the growth step is set lower than that at which the preceding layers, or lower layers than the backing layer are formed in the growth step. The growth temperature at which the layers following the backing layer are formed in the growth step is set lower than that at which the backing layer and the preceding, or lower layers than the backing layer are formed in the growth step. The growth temperature at which the cap layer is formed in the growth step is set lower than that at which preceding layers, or lower than the cap layers are formed in the growth step. For that reason, the carrier concentrations of, in particular, p-type Group II–VI compound semiconductor layers can be prevented from decreasing. As a result, the present invention has the following advantages. Namely, the operating voltage of the semiconductor light emitting device can be lowered, the caloric value can be decreased and the life time of the device can be extended.

Moreover, according to the method for manufacturing semiconductor light emitting device of the present invention, before Group II–VI compound semiconductor layers are grown, the temperature of at least one cell is increased to a temperature higher than that when the Group II–VI compound semiconductor layers are grown. This allows the Group II–VI compound semiconductor layers to have better crystallinity and to prevent the carrier concentration of the p-type Group II–VI compound semiconductor layers from decreasing. As a result, the present invention has the following advantages. Namely, the operating voltage of the semiconductor light emitting device can be lowered, the caloric value can be decreased and the life time can be extended.

The present invention has been described so far. Obviously many modifications and variations of the present invention are possible in the light of the above teachings. It is therefore to be understood that within the scope of the appended claims the invention may be practiced otherwise than as specifically described.

What is claimed is:

1. A method for manufacturing a semiconductor light emitting device, comprising the steps of:

growing a plurality of Group II–VI compound semiconductor layers comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), by irradiating corpuscular beams onto a substrate, respectively; and thereby manufacturing the semiconductor light emitting device comprising at least an n-type cladding layer, an active layer, a p-type cladding layer, a backing layer and a contact layer sequentially stacked on the substrate, wherein a growth temperature in a growth step in which Group II–VI compound semiconductor layers are grown after the backing layer and the following layers are formed, is set lower than the growth temperature of the formation of the preceding layers in the growth step.

2. A method of manufacturing a semiconductor light emitting device according to claim 1, wherein the growth temperature in a growth step after the backing layer and the following layers are formed, is set lower than the growth temperature of the formation of the preceding layers in the growth step, by 15° C. or more.

3. A method for manufacturing a semiconductor light emitting device, comprising the steps of:

growing a plurality of Group II–VI compound semiconductor layers comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), by irradiating corpuscular beams onto a substrate, respectively; and thereby manufacturing the semiconductor light emitting device comprising at least an n-type cladding layer, an active layer, a p-type cladding layer, a backing layer and a contact layer stacked in this order on the substrate, wherein a growth temperature in a growth step in which Group II–VI compound semiconductor layers are grown after the backing layer is formed, is set lower than the growth temperature of the formation of the preceding layers in the growth step.

4. A method of manufacturing a semiconductor light emitting device according to claim 3, wherein the growth temperature in the growth step after the backing layer is formed, is set lower than the growth temperature of the formation of the preceding layers in the growth step, by 15° C. or more.

5. A method for manufacturing a semiconductor light emitting device, comprising the steps of:

growing a plurality of Group II–VI compound semiconductors comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), by irradiating corpuscular beams onto a substrate, respectively; and thereby manufacturing the semiconductor light emitting device comprising at least an n-type cladding layer, an active layer, a p-type cladding layer, a backing layer, a contact layer and a cap layer stacked in this order on the substrate, wherein a growth temperature in a growth step of growing a Group II–VI compound semiconductor for formation of the cap layer is set lower than the growth temperature of the formation of the preceding layers in the growth step.

6. A semiconductor light emitting device according to claim 5, wherein the growth temperature in the growth step of growing the cap layer is set lower than the growth temperature of the formation of the preceding layers in the growth step, by 15° C. or more.

7. A method for manufacturing a semiconductor light emitting device, comprising the steps of:

irradiating corpuscular beams from a plurality of cells by opening and closing shutters within a vacuum container; and manufacturing the semiconductor light emitting device by growing a Group II–VI compound semiconductor layer comprising at least one element of Group II elements of zinc (Zn), magnesium (Mg), beryllium (Be), cadmium (Cd), manganese (Mn) and mercury (Hg) and at least one element of Group VI elements of oxygen (O), sulfur (S), selenium (Se) and tellurium (Te), wherein before growing the Group II–VI compound semiconductor layer, at least one cell is heated and the temperature for heating the cell increases to the temperature higher than the temperature at which the Group II–VI compound semiconductor layer is grown.

8. A method for manufacturing a semiconductor light emitting device according to claim 7, further comprising the step of heating the cells until quantity of corpuscular beams emitted from the shutters reaches $1 \times 10^{-9}$ Torr or less in the atmosphere within the vacuum container.

9. A method for manufacturing a semiconductor light emitting device according to claim 7, further comprising the step of heating a cell which emits corpuscular beams of tellurium.

* * * * *